United States Patent
Kim et al.

(10) Patent No.: US 9,812,201 B2
(45) Date of Patent: Nov. 7, 2017

(54) ELECTRONIC DEVICE INCLUDING VARIABLE RESISTANCE ELEMENT AND METHOD FOR OPERATING THE SAME

(71) Applicant: SK hynix Inc., Icheon (KR)

(72) Inventors: Kyung-Wan Kim, Icheon (KR); Yong-Taek Park, Icheon (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 15/229,044

(22) Filed: Aug. 4, 2016

(65) Prior Publication Data
US 2017/0263317 A1    Sep. 14, 2017

(30) Foreign Application Priority Data
Mar. 14, 2016  (KR) .......................... 10-2016-0030308

(51) Int. Cl.
*G11C 13/00* (2006.01)

(52) U.S. Cl.
CPC ...... *G11C 13/0097* (2013.01); *G11C 13/0007* (2013.01)

(58) Field of Classification Search
CPC ................................................ G11C 13/0069
USPC .......................................................... 365/148
See application file for complete search history.

(56) References Cited

U.S. PATENT DOCUMENTS

| | | | |
|---|---|---|---|
| 7,973,301 B2* | 7/2011 | Happ ................ | G11C 13/0004 257/2 |
| 8,184,470 B2 | 5/2012 | Toda et al. | |
| 2004/0174754 A1* | 9/2004 | Lee ..................... | H04N 3/15 365/200 |
| 2008/0025078 A1* | 1/2008 | Scheuerlein ........... | G11C 5/02 365/163 |
| 2010/0067290 A1* | 3/2010 | Savransky ......... | G11C 13/0004 365/163 |
| 2010/0214829 A1* | 8/2010 | Breitwisch ......... | G11C 13/0004 365/163 |
| 2011/0069540 A1* | 3/2011 | Savransky ......... | G11C 13/0004 365/163 |
| 2012/0039110 A1* | 2/2012 | Maejima ............ | G11C 13/0004 365/148 |
| 2014/0140125 A1* | 5/2014 | Mae .................... | G11C 13/0069 365/148 |

(Continued)

FOREIGN PATENT DOCUMENTS

| | | |
|---|---|---|
| KR | 10-0780773 B1 | 11/2007 |
| KR | 10-2010-0056860 A | 5/2010 |
| KR | 10-1385637 B1 | 4/2014 |

*Primary Examiner* — Min A Huang

(57) ABSTRACT

A method for operating an electronic device including a variable resistance element comprises performing a reset operation on the variable resistance element. The variable resistance element is fully reset by a first reset voltage applied thereto. The performing of the reset operation includes applying a second reset voltage to the variable resistance element, the second reset voltage having a magnitude smaller than that of the first reset voltage, determining whether the variable resistance element is mildly reset or not, and applying a third reset voltage to the variable resistance element when it is determined that the variable resistance element is mildly reset, or terminating the reset operation when it is determined that the variable resistance element is fully reset, the third reset voltage having a magnitude smaller than that of the first reset voltage.

19 Claims, 11 Drawing Sheets

(56) References Cited

U.S. PATENT DOCUMENTS

| | | | |
|---|---|---|---|
| 2014/0185362 A1* | 7/2014 | Haukness | G11C 13/0002 365/148 |
| 2014/0376298 A1* | 12/2014 | Lasser | G11C 7/1006 365/148 |
| 2015/0016177 A1* | 1/2015 | Matsunami | G11C 13/0069 365/148 |
| 2015/0070966 A1* | 3/2015 | Bandyopadhyay | G11C 13/0069 365/148 |
| 2015/0255126 A1* | 9/2015 | Khwa | G11C 29/50008 365/168 |

* cited by examiner

ELECTRONIC DEVICE INCLUDING VARIABLE RESISTANCE ELEMENT AND METHOD FOR OPERATING THE SAME

CROSS-REFERENCE TO RELATED APPLICATIONS

The present application claims priority of Korean Patent Application No. 10-2016-0030308, entitled "ELECTRONIC DEVICE INCLUDING VARIABLE RESISTANCE ELEMENT AND METHOD FOR OPERATING THE SAME" and filed on Mar. 14, 2016, which is incorporated herein by reference in its entirety.

TECHNICAL FIELD

This patent document relates to memory circuits or devices and their applications in electronic devices or systems.

BACKGROUND

Recently, as electronic appliances trend toward miniaturization, low power consumption, high performance, multifunctionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device which includes a variable resistance element having an improved characteristic, and method for operating the same.

In an implementation, a method for operating an electronic device including a variable resistance element is provided wherein the variable resistance element switches from a high resistance state to a low resistance state by performing a set operation and switches from the low resistance state to the high resistance state by performing a reset operation, and is fully reset by a first reset voltage applied thereto, the method comprising: performing the reset operation on the variable resistance element, wherein the performing of the reset operation comprises: applying a second reset voltage to the variable resistance element, the second reset voltage having a magnitude smaller than that of the first reset voltage; determining whether the variable resistance element is mildly reset or not; and applying a third reset voltage to the variable resistance element when it is determined that the variable resistance element is mildly reset, or terminating the reset operation when it is determined that the variable resistance element is fully reset, the third reset voltage having a magnitude smaller than that of the first reset voltage.

Implementations of the above method may include one or more the following.

The magnitude of the third reset voltage is smaller than or substantially equal to the magnitude of the second reset voltage. The first, second, and third reset voltages have the same polarity. When the first reset voltage is applied to the variable resistance element, a current flowing through the variable resistance element has a first magnitude, and wherein determining whether the variable resistance element is mildly reset or not includes determining whether the current flowing through the variable resistance element has a second magnitude or not, the second magnitude being greater than the first magnitude. A resistance state of the variable resistance element varies depending on whether a conductive filament is formed in a variable resistance layer of the variable resistance element or not. A size of the conductive filament formed when the variable resistance element is mildly reset is larger than a size of the conductive filament formed when the variable resistance element is fully reset. The variable resistance layer includes a metal oxide, and the conductive filament includes oxygen vacancies included in the metal oxide. The electronic device includes a plurality of variable resistance elements including the variable resistance element, and the plurality of variable resistance elements are fully reset by applying the first reset voltage thereto. A minimum current among a plurality of currents flowing through the plurality of variable resistance elements in the low resistance state is a set current, the set current having a first magnitude, wherein a maximum current among a plurality of currents flowing through a first plurality of variable resistance elements that is fully reset is a first reset current, the first reset current having a second magnitude, wherein a maximum current among a plurality of currents flowing through a second plurality of variable resistance elements that is mildly reset is a second reset current, the second reset current having a third magnitude, and wherein, when the variable resistance element is determined to be mildly reset, a current flowing through the variable resistance element has a magnitude between the second and third magnitudes that are smaller than the first magnitude of the set current.

In another implementation, an electronic device comprises a variable resistance element changing from a high resistance state to a low resistance state by performing a set operation and changing from the low resistance state to the high resistance state by performing a reset operation, a first reset voltage being applied to the variable resistance element to fully reset the variable resistance element, wherein the variable resistance element is mildly reset when a second reset voltage having a magnitude smaller than that of the first reset voltage is applied to the variable resistance element, and wherein the variable resistance element is fully reset when a third reset voltage having a magnitude smaller than that of the first reset voltage is applied to the variable resistance element after the variable resistance element is mildly reset.

Implementations of the above electronic device may include one or more the following.

The magnitude of the third reset voltage is smaller than or substantially equal to the magnitude of the second reset voltage. The first, second, and third reset voltages have the same polarity. When a current flowing through the variable resistance element that is fully reset has a first magnitude, and the current flowing through the variable resistance element that is mildly reset has a second magnitude, the second magnitude is greater than the first magnitude. The variable resistance element includes a variable resistance layer, and wherein a resistance state of the variable resistance element varies depending on whether a conductive filament is formed in the variable resistance layer or not. A size of the conductive filament when the variable resistance element is mildly reset is larger than a size of the conductive filament when the variable resistance element is fully reset. The variable resistance layer includes a metal oxide, and the conductive filament includes oxygen vacancies included in the metal oxide. The electronic device includes a plurality of variable resistance elements including the variable resistance element. The plurality of variable resistance elements are fully reset by applying the first reset voltage thereto, wherein a minimum current among a plurality of currents flowing through the plurality of variable resistance elements in the low resistance state is a set current, the set current having a first magnitude, wherein a maximum current among a plurality of currents flowing through a first plurality of variable resistance elements that is fully reset is a first reset current, the first reset current having a second magnitude, wherein a maximum current among a plurality of currents flowing through a second plurality of variable resistance elements that is mildly reset is a second reset current, the second reset current having a third magnitude, and wherein, when the variable resistance element is determined to be mildly reset, a current flowing through the variable resistance element has a magnitude between the second and third magnitudes that are smaller than the first magnitude of the set current.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the variable resistance element is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the variable resistance element is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the variable resistance element is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the variable resistance element is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the variable resistance element is part of the memory or the buffer memory in the memory system.

In another implementation, a method for operating an electronic device including a variable resistance element is provided wherein the variable resistance element switches from a high resistance state to a low resistance state by performing a set operation and switches from the low resistance state to the high resistance state by performing a reset operation, the method comprising: applying a first voltage to the variable resistance element to mildly reset the variable resistance element, the first voltage having the same polarity as a polarity of a reset voltage and a magnitude smaller than a magnitude of the reset voltage, the magnitude of the reset voltage being sufficiently large to cause the variable resistance element to be fully reset; and applying a second voltage to the variable resistance element to fully reset the variable resistance element after the variable resistance element is mildly reset, the second voltage having the same polarity as the polarity of the reset voltage and a magnitude smaller than the magnitude of the reset voltage.

Implementations of the above method may include the following.

The magnitude of the second voltage is smaller than or substantially equal to the magnitude of the first voltage.

These and other aspects, implementations and associated advantages are described in greater detail in the drawings, the description and the claims.

DETAILED DESCRIPTION

Figure 1A:
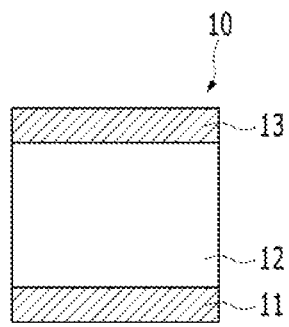
FIGS. 1A to 1E illustrate a method for operating a variable resistance element according to a comparative example.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Prior to describing drawings, a variable resistance element according to an implementation will be briefly described. The variable resistance element may switch between different resistance states according to a voltage or a current applied thereto. The variable resistance element may store different data depending on its resistance state, thereby serving as a memory cell in a semiconductor memory. When the variable resistance element is in a low resistance state, the variable resistance element may store data having a logic high value. On the other hand, when the variable resistance element is in a high resistance state, the variable resistance element may store data having a logic low value. An operation in which a resistance state of the variable resistance element changes from the high resistance state to the low resistance state may be referred to as a set operation, and a voltage applied to the variable resistance element for the set operation may be referred to as a set voltage. On the other hand, an operation in which the resistance state of the variable resistance element changes from the low resistance state to the high resistance state may be referred to as a reset operation, and a voltage applied to the variable resistance element for the reset operation may be referred to as a reset voltage. A polarity of the set voltage may be different from a polarity of the reset voltage. Each of the set voltage and the reset voltage may have a pulse waveform.

Here, it is often desirable to set the set voltage and the reset voltage to have sufficiently high levels. This is because various electronic devices such as a semiconductor memory include a number of variable resistance elements and at least some of these variable resistance elements may have different resistance values due to various causes, for example, positions, fabricating processes, operations performed immediately before, etc., although the variable resistance elements are in the same resistance state. For example, when a resistance value of a first variable resistance element is smaller than that of a second variable resistance element while both the first variable resistance element and the second variable resistance element are in a low resistance state, a voltage suitable for resetting the first variable resistance element may be greater than a voltage suitable for resetting the second variable resistance element. However, it is difficult to check a suitable reset voltage of each of all the variable resistance elements, and to provide different reset voltages to the variable resistance elements based on the checking results. Therefore, it is preferable to set a reset voltage to a sufficient high level capable of resetting both the first and second variable resistance elements.

However, when a reset voltage is set to a high level as described above, operation issues may occur. For example, when the reset voltage exceeds a certain level, a current flowing through a variable resistance element decreases initially, and then increases as the reset voltage further increases, as will be described in more detail with reference to FIGS. 1A to 1E.

FIGS. 1A to 1E illustrate a method for operating a variable resistance element according to a comparative example.

Referring to FIG. 1A, a variable resistance element 10 of the comparative example may include a first electrode 11, a second electrode 13, and a variable resistance layer 12 disposed between the first electrode 11 and the second electrode 13.

The first electrode 11 and the second electrode 13 may be used to apply a current or a voltage across the variable resistance layer 12, and include one or more conductive materials.

The variable resistance layer 12 may have a characteristic which switches between different resistance states according to the current or the voltage applied across the variable resistance layer 12, and include one or more variable resistance materials. Specially, a resistance state of the variable resistance layer 12 may vary depending on whether a conductive filament is continuously formed in the variable resistance layer 12 to electrically connect the first electrode 11 and the second electrode 13 or the conductive filament is cut in the variable resistance layer 12 between the first electrode 11 and the second electrode 13. For example, the variable resistance layer 12 may include a metal oxide which contains oxygen vacancies. In this case, the conductive filament is formed or cut by a movement of the oxygen vacancies. Hereinafter, an operating method of the variable resistance element 10 will be described in more detail with reference to FIGS. 1A to 1E.

First, FIG. 1A illustrates the variable resistance layer 12 in an initial state in which the conductive filament may not exist yet. Therefore, the variable resistance element 10 may have a high resistance state. Here, the initial state may be a state that no voltage has been applied to the first electrode 11 and the second electrode 13 since the variable resistance element 10 has been fabricated.

Figure 1B:
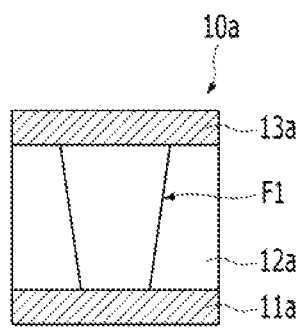

Then, referring to FIG. 1B, a set operation is performed by applying a set voltage across a first variable resistance element 10a, which corresponds to an example of the variable resistance element 10 of FIG. 1A. As a result, a first conductive filament F1 is continuously formed in a first variable resistance layer 12a, such that the first conductive filament F1 electrically connects a first electrode 11a and a second electrode 13a, which correspond to examples of the first electrode 11 and the second electrode 13 of FIG. 1A, respectively. Therefore, the first variable resistance element 10a that is initially in a high resistance state may change to a low resistance state. When the conductive filament F1 includes oxygen vacancies, a first voltage, which is relatively positive compared to a second voltage applied to the first electrode 11a, may be applied to the second electrode 13a so that the oxygen vacancies move in a direction toward the first electrode 11a from the second electrode 13a to create the conductive filament F1.

Figure 1C:
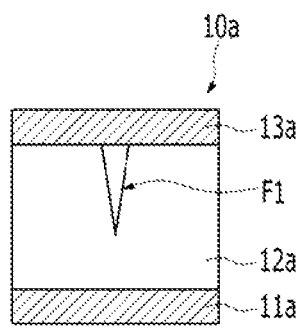

Then, referring to FIG. 1C, a reset operation may be performed by applying a reset voltage to the first variable resistance element 10a, such that the conductive filament F1 is cut. Therefore, the first variable resistance element 10a in the low resistance state of FIG. 1B may change to a high resistance state. When the conductive filament F1 includes oxygen vacancies, a third voltage, which is relatively positive compared to a fourth voltage applied to the second electrode 13a, may be applied to the first electrode 11a. Thus, some of the oxygen vacancies in a second end portion of the variable resistance layer 12a proximate to the first electrode 11a move toward the second electrode 13a. As a result, the conductive filament F1 may exist only up to a certain distance from the second electrode 13a, and may not reach the first electrode 11a. That is, the conductive filament F1 may have a cut shape, such that it cannot electrically connect the first electrode 11a and the second electrode 13a.

The set operation of FIG. 1B and the reset operation of FIG. 1C may be performed repeatedly, such that switching operations between the low resistance state and the high resistance state may be repeatedly performed.

However, as described above, different variable resistance elements may have different resistance values because of a resistance distribution, although they are in the same resistance state. For example, referring to FIGS. 1D and 1E, a second variable resistance element 10b, which correspond to another example of the variable resistance element 10 of FIG. 1A, includes a first electrode 11b and a second electrode 13b corresponding to examples of the first electrode 11 and the second electrode 13 of FIG. 1A, respectively. The second variable resistance element 10b further includes a variable resistance layer 12b disposed between the first electrode 11b and the second electrode 13b.

Figure 1D:
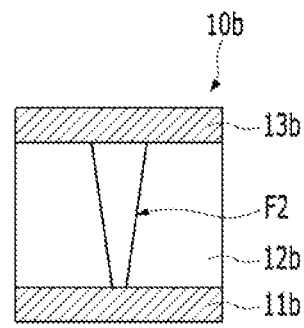
Figure 1E:
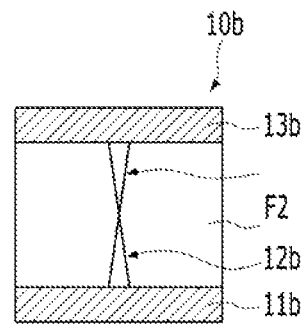

Referring to FIG. 1D, when a set voltage having the same level as the set voltage in the set operation of FIG. 1B is applied across the second variable resistance element 10b, a second conductive filament F2 having a smaller size than the first conductive filament F1 of FIG. 1B is formed in the variable resistance layer 12b. Thus, the second variable resistance element 10b of FIG. 1D may be in a state that can be reset more easily, compared to the first variable resistance element 10a of FIG. 1B. Therefore, when a reset voltage having the same level as the reset voltage in the reset operation of FIG. 1C is applied to the second variable resistance element 10b, a magnitude of the reset voltage may be excessive. That is, as shown in FIG. 1E, additional oxygen vacancies may appear in an end portion of the variable resistance layer 12b proximate to the first electrode 11b, thereby forming a parasitic conductive filament F' that tapers toward the second electrode 13b. The parasitic conductive filament F' may be connected with the second conductive filament F2 which is reduced as the reset voltage is applied to of the second variable resistance element 10b, such that the parasitic conductive element F' and the second conductive filament F2 may electrically connect the first electrode 11b and the second electrode 13b. As a result, a reset operation of the second variable resistance element 10b may not be properly performed using the same reset voltage as the first variable resistance element 10a. However, if a level of the reset voltage is reduced to prevent formation of the parasitic conductive filament F' in the variable resistance layer 12b and the reduced reset voltage is applied across the first variable resistance element 10a of FIG. 1B, because the first variable resistance element 10a has the first conductive filament F1 with a greater size than the second conductive filament F2, the reduced reset voltage may not be sufficiently high to properly perform a reset operation on the first variable resistance element 10a of FIG. 1B.

As a result, such a deteriorated switching characteristic may lead to an increase in operation errors and a reduction in endurance of the variable resistance element 10.

The present disclosure will provide a variable resistance element which can address the above issues and improve a switching characteristic.

FIGS. 2A to 2F illustrate a method for operating a variable resistance element according to an implementation.

Figure 2A:
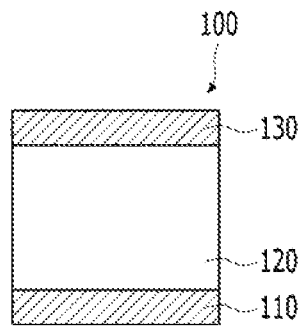
FIGS. 2A to 2F illustrate a method for operating a variable resistance element according to an implementation.

Referring to FIG. 2A, a variable resistance element 100 of the present disclosure may include a first electrode 110, a second electrode 130, and a variable resistance layer 120 disposed between the first electrode 110 and the second electrode 130.

The first electrode 110 and the second electrode 130 may be used to apply a current or a voltage across the variable resistance layer 120, and each of the first and second electrodes 110 and 130 has a single-layered structure or a multi-layered structure including one or more conductive materials, for example, a metal such as W, Al or Ti, a metal nitride such as TiN, or a combination thereof.

The variable resistance layer 120 may have a characteristic which switches between different resistance states according to the current or the voltage applied across the variable resistance layer 120, and may have a single-layered structure or a multi-layered structure including one or more variable resistance materials. When the variable resistance layer 120 has a multi-layered structure, the variable resistance layer 120 may show a variable resistance characteristic by a combination of multiple layers. The variable resistance material may include any of various materials that are used in an RRAM, a PRAM, an FRAM, an MRAM, or the like. The various materials may include metal oxides such as transition metal oxides or perovskite-based materials, phase-change materials such as chalcogenide-based materials, ferroelectric materials, ferromagnetic materials, and the like.

Specially, a resistance state of the variable resistance layer 120 may vary depending on whether a conductive filament is continuously formed in the variable resistance layer 120 to electrically connect the first electrode 110 and the second electrode 130 or the conductive filament is cut in the variable resistance layer 120 between the first electrode 110 and the second electrode 130. For example, the variable resistance layer 120 may include a metal oxide which contains a large amount of oxygen vacancies. The metal oxide may include a material having an oxygen content lower than a stoichiometric ratio, for example, TiOx (x<2), TaOy (y<2.5), or the like. However, other implementations are also possible when the variable resistance layer 120 includes a material in which a conductive filament can be formed or cut.

Operating methods of first and second variable resistance elements 100a and 100b, each of which corresponds to the variable resistance element 100 of FIG. 2A according to an implementation, will be described as follows.

First, FIG. 2A illustrates the variable resistance layer 120 in an initial state in which the conductive filament may not exist yet. Therefore, the variable resistance element 100 may have a high resistance state. In an implementation, the initial state may be a state that no voltage has been applied to the first electrode 110 and the second electrode 130 since the variable resistance element 100 has been fabricated.

Figure 2B:
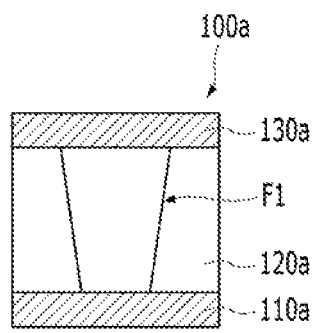

Then, referring to FIG. 2B, a set operation is performed by applying a set voltage to the first variable resistance element 100a. As a result, a first conductive filament F1 is continuously formed in a first variable resistance layer 120a corresponding to the variable resistance layer 120 of FIG. 2A according to an implementation, such that the first conductive filament F1 electrically connects a first electrode 110a and a second electrode 130a, which correspond to the first electrode 110 and the second electrode 130 of the variable resistance element 100, respectively, according to an implementation. Therefore, the first variable resistance element 100a that is initially in a high resistance state may change to a low resistance state. When the first conductive filament F1 includes oxygen vacancies, a first voltage, which is relatively positive compared to a second voltage applied to the first electrode 110a, may be applied to the second electrode 130a so that the oxygen vacancies move in a direction toward the first electrode 110a from the second electrode 130a to create the conductive filament F1.

Figure 2C:
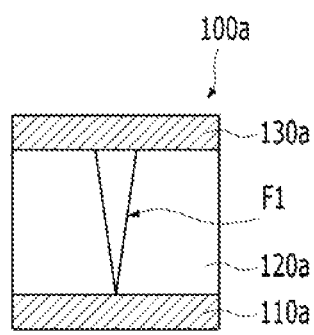
Figure 2D:
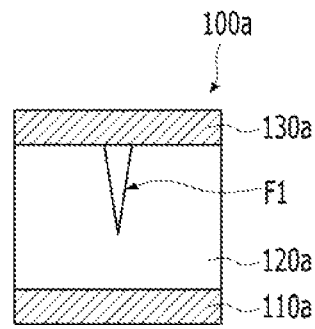
Figure 2E:
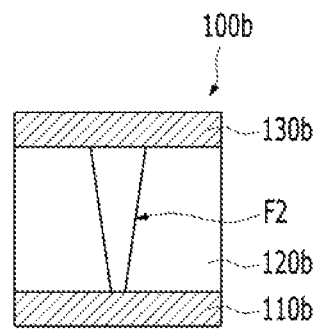

Referring to FIG. 2E, the set operation is also performed on the second variable resistance element 100b, such that a second conductive filament F2 is formed in a second variable resistance layer 120b corresponding to the variable resistance layer 120 of FIG. 2A according to an implementation.

Here, the first conductive filament F1 of FIG. 2B may have a size greater than the second conductive filament F2 of FIG. 2E. In the implementations shown in FIGS. 2A to 2F, the size of the first or second conductive filament F1 or F2 indicates a resistance value of a corresponding variable resistance element 100a or 100b. However, other implementations are also possible. For example, although not illustrated, the first conductive filament F1 includes a first plurality of conductive filaments and the second conductive filament F2 includes a second plurality of conductive filaments, and a number of the first plurality of conductive filament may be greater than a number of the second plurality of conductive filaments.

Meanwhile, regardless of the size and/or the number of the conductive filament, that is, regardless of different resistance values of a plurality of variable resistance elements that include the first and second variable resistance element 100a and 100b, a voltage having a large magnitude to fully reset the plurality of the variable resistance elements, that is, to completely cut conductive filaments in the plurality of variable resistance elements including the first and second conductive filaments F1 and F2, may be referred to as a first reset voltage. When a variable resistance element is determined to be fully reset by the first reset voltage applied thereto, the variable resistance element is in a high resistance state to store a first logic value (e.g., a logic low value). A polarity of the first reset voltage may be opposite to a polarity of the set voltage. For example, when the first and second conductive filaments F1 and F2 include oxygen vacancies, a first voltage, which is relatively positive compared to a second voltage applied to the second electrodes 130a and 130b, may be applied to the first electrodes 110a and 110b. As a result, some of the oxygen vacancies in end portions of the variable resistance layers 120a and 120b proximate to the first electrodes 110a and 110b move toward the second electrodes 130a and 130b, respectively. As a result, the first and second conductive filaments F1 and F2 may be cut.

Referring to FIG. 2C, a first reset operation may be performed by applying a second reset voltage to the first electrode 110a and the second electrode 130a of the first variable resistance element 100a. The second reset voltage may have the same polarity as a polarity of the first reset voltage, and a magnitude of the second reset voltage is smaller than a magnitude of the first reset voltage. For example, the second reset voltage has a level equal to or less than 90%, 75%, 50%, or 25% of a level of the first reset voltage. Here, as shown in FIG. 2C, the variable resistance element 100a may be in a state in which the first conductive filament F1 is not cut completely due to a resistance value of the variable resistance element 100a. This state may be referred to as a mildly reset state compared to a fully reset state in which the first conductive filament F1 is completely cut. For example, when the conductive filament F1 of the variable resistance element 100a has a relatively large size as shown in FIG. 2B and the second reset voltage is applied across the variable resistance layer 120a, an end portion of the first conductive filament F1 proximate to the first electrode 110a is still in contact with the first electrode 110a and is not completely cut as shown in FIG. 2C. In an implementation, the contacting end portion of the first conductive filament F1 of FIG. 2C has a width that is equal to or less than 1%, 3%, 5%, 10%, or 20% of a width of a corresponding portion of the first conductive filament F1 of FIG. 2B. That is, the variable resistance element 100a may be mildly reset.

Figure 2F:
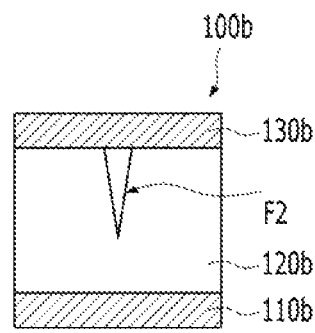

On the other hand, when the second conductive filament F2 of the second variable resistance element 100b has a relatively small size as shown in FIG. 2E and the second reset voltage is applied across the second variable resistance layer 120b, the second conductive filament F2 can be completely cut as shown in FIG. 2F. That is, the second variable resistance element 100b may be fully reset.

Therefore, when the first variable resistance element 100a is mildly reset, an additional reset operation for fully resetting the variable resistance element 100a may be performed. Since a resistance value of the variable resistance element 100 may correspond to the first or second variable resistance element 100a or 100b according to an implementation, whether the variable resistance element 100 is mildly reset or fully reset is unknown, and thus a verify operation may be performed after a reset operation is performed on the variable resistance element 100.

According to a result of the verify operation, after the first reset operation has been performed, when it is determined that the variable resistance element 100 is fully reset as shown in FIG. 2F, a subsequent reset operation may not be performed. On the other hand, when it is determined that the variable resistance element 100 is mildly reset as shown in FIG. 2C, a second reset operation may be performed.

Referring to FIG. 2D, the second reset operation to completely cut the first conductive filament F1 of the first variable resistance element 100a may be performed by applying a third reset voltage to the first variable resistance element 100a of FIG. 2C which is mildly reset. The third reset voltage may have a magnitude smaller than that of the first reset voltage. The third reset voltage may have the same polarity as that of the second reset voltage. When the variable resistance element 100a is mildly reset, the conductive filament F1 is almost cut. Therefore, even by applying the third reset voltage whose magnitude is smaller than that of the first reset voltage, the conductive filament F1 may be completely cut. It is desirable to reduce the magnitude of the third reset voltage to prevent formation of a parasitic conductive filament in the variable resistance layer 120a. In another implementation, the third reset voltage may have a magnitude smaller than or substantially equal to that of the second reset voltage. In still another implementation, the third reset voltage may have a magnitude that is slightly greater than that of the second reset voltage.

As a result, the variable resistance element 100 may be fully reset regardless of an actual resistance value of the variable resistance element 100 through the above multi-step reset operation including, e.g., the first and second reset operations.

Meanwhile, when a set voltage is again applied to the variable resistance element 100a or 100b which has been fully reset as shown in FIG. 2D or FIG. 2F, the variable resistance element 100a or 100b may change to the low resistance state again as shown in FIG. 2B or FIG. 2E. Also, when the second and third reset voltages are again applied to the first variable resistance element 100a in the low resistance state of FIG. 2B, the first variable resistance element 100a may change to the high resistance state as shown in FIG. 2D. When the second reset voltage is again applied to the second variable resistance element 100b in the low resistance state of FIG. 2E, the variable resistance element 100b may change to the high resistance state again as shown in FIG. 2F. By this method, the variable resistance element 100 (e.g., the first or second variable resistance element 100a or 100b) may repeatedly switch between the low resistance state and the high resistance state, and a certain variable resistance element 100 (e.g., the first variable resistance element 100a) may switch to the high resistance state by the two step reset operation.

By the aforementioned operating method of the present disclosure, a reset voltage having a smaller magnitude than a reset voltage used in the comparative example may be used to prevent a parasitic conductive filament from being formed. Furthermore, a variable resistance element according to an implementation may be fully reset by the multi-step reset operation. Therefore, a switching characteristic of a variable resistance element may be improved, and thus a data storage characteristic of a semiconductor memory which includes this variable resistance element as a memory cell may be also improved.

Figure 3:
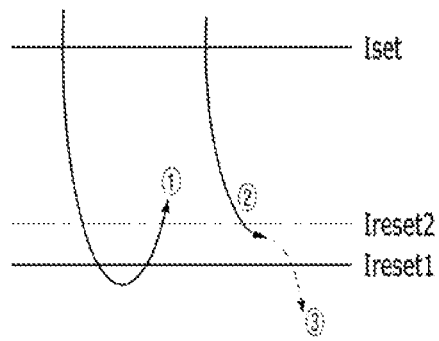
FIG. 3 illustrates a current level of a variable resistance element of the comparative example of FIG. 1 and a current level of a variable resistance element according to an implementation.

FIG. 3 illustrates a current level of a variable resistance element of the comparative example of FIG. 1 and a current level of a variable resistance element according to an implementation.

Referring to FIG. 3, when a first plurality of currents flow through a plurality of variable resistance elements in a set state, a minimum current among the first plurality of currents may be referred to as a set current Iset. In addition, when a second plurality of currents flow through the plurality of variable resistance elements that are in a fully reset state, a maximum current among the second plurality of currents may be referred to as a first reset current Ireset1. When a third plurality of currents flow through the plurality of variable resistance elements that are in a mildly reset state, a maximum current among the third plurality of currents may be referred to as a second reset current Ireset2. In an implementation, one or more of the set current Iset, the first reset current Ireset1, and the second reset current Ireset2 can be determined using a prototype that includes a plurality of variable resistance elements fabricated under the same manufacturing processes. The set current Iset may have a magnitude greater than magnitudes of the first reset current Ireset1 and the second reset current Ireset2. The second reset current Ireset2 may have a magnitude greater than that of the first reset current Ireset1.

Here, a curve ① illustrates a change in a magnitude of a current flowing through the second variable resistance element 10b of the comparative example shown in FIGS. 1D and 1E. Referring to the curve ①, in the variable resistance element 10b of the comparative example, the magnitude of the current may be reduced to be less than or substantially equal to the first reset current Ireset1 as a level of a voltage applied across the variable resistance layer 12b increases during a reset operation. However, when the voltage applied to the variable resistance element 10b exceed a certain level, the parasitic filament F' is formed as shown in FIG. 1E, and thus the magnitude of the current flowing through the variable resistance element 10b increases again, thereby exceeding the first reset current Ireset1. That is, the variable resistance element 10b may not be fully reset.

On the other hand, curves ② and ③ illustrates a change in a magnitude of a current flowing through the first variable resistance element 100a shown in FIGS. 2B to 2D. Specifically, referring to the curve ②, in the variable resistance element 100a, the magnitude of the current may be reduced, during a first reset operation in which a second reset voltage having a smaller magnitude than a first reset voltage is applied, such that the magnitude of the current becomes less than or substantially equal to the second reset current Ireset2 and greater than the first reset current Ireset1. That is, the variable resistance element 100a may be mildly reset. Then, referring to the curve ③, a third reset voltage having a smaller magnitude than the first reset voltage may be further applied to the variable resistance element 100a which has been mildly reset, during a second reset operation. Therefore, the current flowing through the variable resistance element 100a may be further reduced to be less than or substantially equal to the first reset current Ireset1. That is, the variable resistance element 100a may be fully reset.

Figure 4:
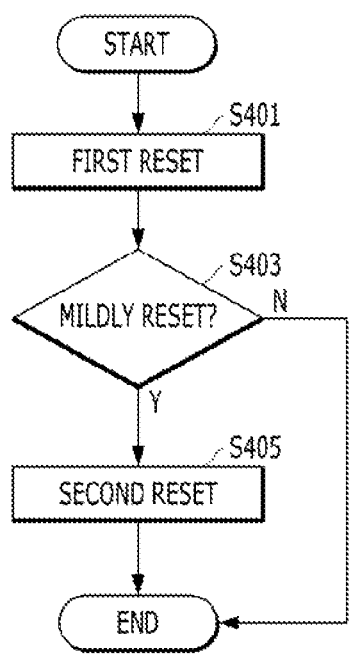
FIG. 4 is a flow chart illustrating a reset operation of a variable resistance element according to an implementation.

FIG. 4 is a flow chart illustrating a reset process 400 of a variable resistance element according to an implementation.

Referring to FIG. 4, a first reset operation may be performed (S401). When a first reset voltage fully resets a plurality of variable resistance elements each having a low resistance state, that is, a set state, in the first reset operation, a second reset voltage which has a magnitude smaller than that of the first reset voltage may be applied to the variable resistance element.

Then, it is verified whether the variable resistance element on which the first reset operation has been performed is mildly reset or not by detecting a magnitude of a current flowing through the variable resistance element by applying a predetermined read voltage to the variable resistance element (S403).

As described above with reference to FIG. 3, a maximum current among a first plurality of currents flowing through a plurality of variable resistance elements that are in a fully reset state may be referred to as a first reset current (e.g., the first reset current Ireset1 of FIG. 3), and a maximum current among a second plurality of currents flowing through a plurality of variable resistance elements that are in a mildly reset state may be referred to as a second reset current (e.g., the second reset current Ireset2 of FIG. 3).

When the magnitude of the current flowing through the variable resistance element is less than or substantially equal to the second reset current Ireset2 and greater than the first reset current Ireset1, it may be determined that the variable resistance element is in the mildly reset state. When the magnitude of the current flowing through the variable resistance element is less than or substantially equal to the first reset current Ireset1, it may be determined that the variable resistance element is in the fully reset state.

According to a result of the verify operation at S403, when it is determined that the variable resistance element is in the fully reset state, the process 400 may be terminated.

On the other hand, when it is determined that the variable resistance element is in the mildly reset state, a second reset operation may be performed (S405), and then, the process 400 may be terminated. In the second reset operation, a third reset voltage having a magnitude that is smaller than or substantially equal to that of the first reset voltage, that of the second reset voltage, or both may be applied.

Meanwhile, in the above implementation, two reset operations are performed at S401 and S405. However, implementations of the present disclosure are not limited thereto. For example, in other implementations, more than two reset operations may be performed until a variable resistance element is fully reset. In these implementations, one or more reset voltages having magnitudes that are smaller than or substantially equal to that of the above first reset voltage may be applied to a variable resistance element until it is determined that the variable resistance element is fully reset.

In an implementation, the aforementioned reset voltage may have a pulse waveform. An example of the reset voltage will be described below with reference to FIG. 5.

Figure 5:
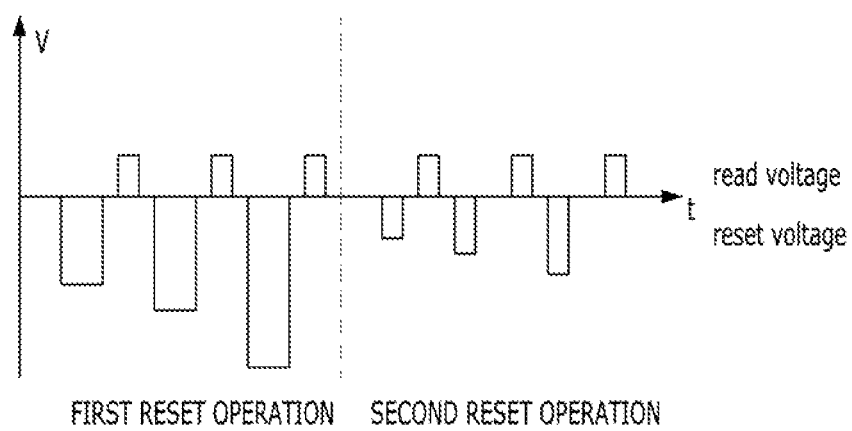
FIG. 5 is a graph illustrating reset voltage pulses applied during a reset operation of a variable resistance element according to an implementation.

FIG. 5 is a graph illustrating reset voltage pulses applied during a reset operation of a variable resistance element according to an implementation.

Referring to FIG. 5, during a first reset operation, one or more first reset voltage pulses may be applied to a variable resistance element. In the implementation shown in FIG. 5, magnitudes of the first reset voltage pulses may gradually increase. However, in other implementations, magnitudes of the first reset voltage pulses may be substantially constant, or gradually decrease. Read voltage pulses for performing a verification operation may be applied such that each of the read voltage pulses is applied between two sequential first reset voltage pulses. Magnitudes of the read voltage pulses may be substantially constant. In FIG. 5, three first reset voltage pulses and three read voltage pulses are applied during the first reset operation, but the number of these pulses may be changed in various manners. For example, when it is determined that the variable resistance element is in a mildly reset state after a first one or a second one of the first reset voltage pulses is applied, the first reset operation may be terminated before applying the second one or a third one of the first reset voltage pulses.

When it is determined that the variable resistance element is in the mildly reset state after completing the first reset operation, a second reset operation may be performed. During the second reset operation, one or more second reset voltage pulses may be applied to the variable resistance element. In the implementation shown in FIG. 5, magnitudes of the second reset voltage pulses may gradually increase. However, in other implementations, magnitudes of the second reset voltage pulses may be substantially constant, or gradually decrease. Read voltage pulses for performing a verification operation may be applied such that each of the read voltage pulses is applied between two sequential second reset voltage pulses. Magnitudes of the read voltage pulses may be substantially constant. In FIG. 5, three second reset voltage pulses and three read voltage pulses are applied during the second reset operation, but the number of these pulses may be changed in various manners. For example, when it is determined that the variable resistance element is in a fully reset state after a first one or a second one of the second reset voltage pulses, the second reset operation may be terminated before applying the second one or a third one of the three second reset voltage pulses.

Here, as described above, a magnitude of a first reset voltage (e.g., the second reset voltage at S401 of FIG. 4) applied during the first reset operation may be greater than that of a second reset voltage (e.g., the third reset voltage at S405 of FIG. 4) applied during the second reset operation. Therefore, as shown in FIG. 5, a magnitude of each of the first reset voltage pulses applied during the first reset operation may be greater than that of a corresponding one of the second reset voltage pulses applied during the second reset operation.

However, other implementations may be also possible. For example, the magnitude of the first reset voltage applied during the first reset operation may be substantially the same as or smaller than that of the second reset voltage applied during the second reset operation. Therefore, the magnitude of each of the first reset voltage pulses applied during the first reset operation may be substantially the same as or smaller than that of a corresponding one of the second reset voltage pulses applied during the second reset operation.

Accordingly, one or more additional voltages may be applied to the variable resistance element that is in a mildly reset state, thereby leading the variable resistance element to a fully reset state. In an implementation, each of the one or more additional voltages may have a magnitude that is sufficiently small to prevent formation of a parasitic conductive filament in a variable resistance layer of the variable resistance element.

The aforementioned variable resistance element may function as a portion of a memory cell. A plurality of memory cells may be arranged in various manners to constitute a cell array. This will be exemplarily described with reference to FIG. 6.

Figure 6:
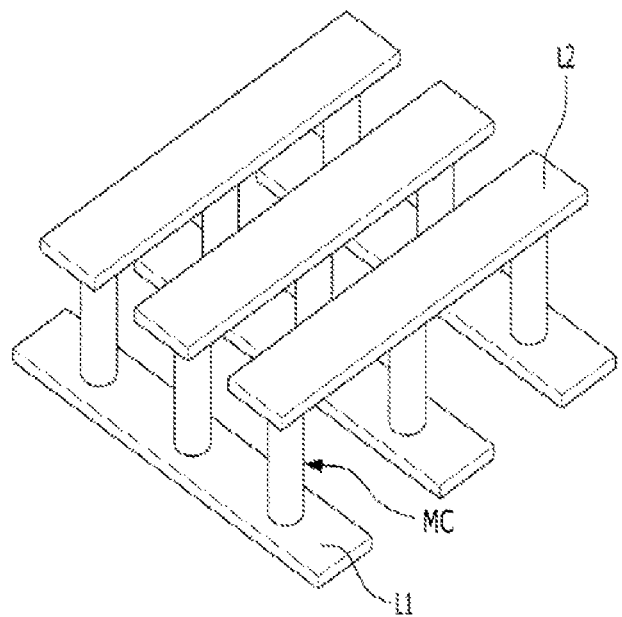
FIG. 6 is a perspective view illustrating a semiconductor memory according to an implementation.

FIG. 6 is a perspective view illustrating a semiconductor memory according to an implementation.

Referring to FIG. 6, a semiconductor memory may include a plurality of first lines L1 disposed over a substrate (not shown), each of the first lines L1 extending in a first direction, a plurality of second lines L2 disposed over the first lines L1, each of the second lines L2 extending in a second direction crossing the first direction, and a plurality of memory cells MC disposed between the first lines L1 and the second lines L2 and at intersections of the first lines L1 and the second lines L2, respectively.

The first lines L1 and the second lines L2 may transmit a voltage or a current to the memory cells MC, and have a single-layered structure or a multi-layered structure including one or more of various conductive materials including a metal, a metal nitride, etc. Positions of the first lines L1 and the second lines L2 may be reversed with each other.

Each of the memory cells MC may include the aforementioned variable resistance element (e.g., the variable resistance element 100 of FIG. 2A). Furthermore, each of the memory cells MC may include a selection element, which is coupled to one end of a variable resistance element and controls an access to the variable resistance element.

Here, the variable resistance element may be fully reset by applying the aforementioned reset voltage to the variable resistance element coupled to a corresponding one of the first lines L1 and a corresponding one of the second lines L2. Specifically, when a plurality of variable resistance elements are included in the memory cells MC, a voltage which can fully reset all of the plurality of variable resistance elements included in the memory cells MC is referred to as a first reset voltage. In an implementation, in order to reset the plurality of variable resistance elements, a second reset voltage having a magnitude smaller than that of the first reset voltage may be applied in a reset operation, and then a verification operation and an additional reset operation may be performed at least one time until all of the plurality of variable resistance elements are determined to be in the fully reset state.

For this reason, a switching characteristic of the variable resistance element may be improved, and thus a data storage characteristic of a semiconductor memory may be also improved.

Meanwhile, in an implementation, a verification operation may be omitted. For example, the second reset voltage is applied during a first reset operation, and then a third reset voltage having a magnitude smaller than or substantially equal to that of the second reset voltage may be applied during a second reset operation without performing a verification operation between the first and second reset operations.

The above and other memory circuits or semiconductor devices based on the disclosed technology can be used in a range of devices or systems. FIGS. 7-11 provide some examples of devices or systems that can implement the memory circuits disclosed herein.

Figure 7:
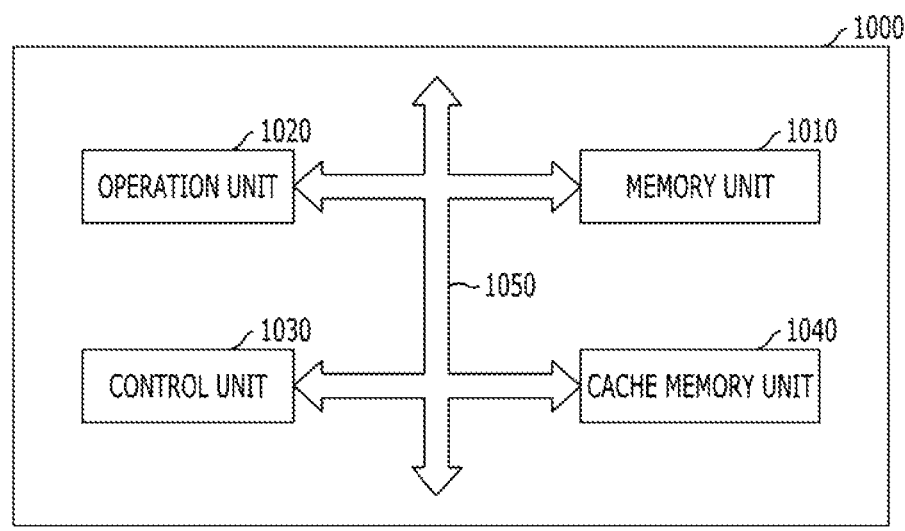
FIG. 7 is an example of a configuration diagram of a microprocessor implementing memory circuitry based on the disclosed technology.

FIG. 7 is an example of configuration diagram of a microprocessor implementing memory circuitry based on the disclosed technology.

Referring to FIG. 7, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a variable resistance element changing from a high resistance state to a low resistance state by performing a set operation and changing from the low resistance state to the high resistance state by performing a reset operation, a first reset voltage being applied to the variable resistance element to fully reset the variable resistance element, wherein the variable resistance element is mildly reset when a second reset voltage having a magnitude smaller than that of the first reset voltage is applied to the variable resistance element, and wherein the variable resistance element is fully reset when a third reset voltage having a magnitude smaller than that of the first reset voltage is applied to the variable resistance element after the variable resistance element is mildly reset Through this, data storage characteristics and operating characteristics of the memory unit 1010 may be improved. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 8:
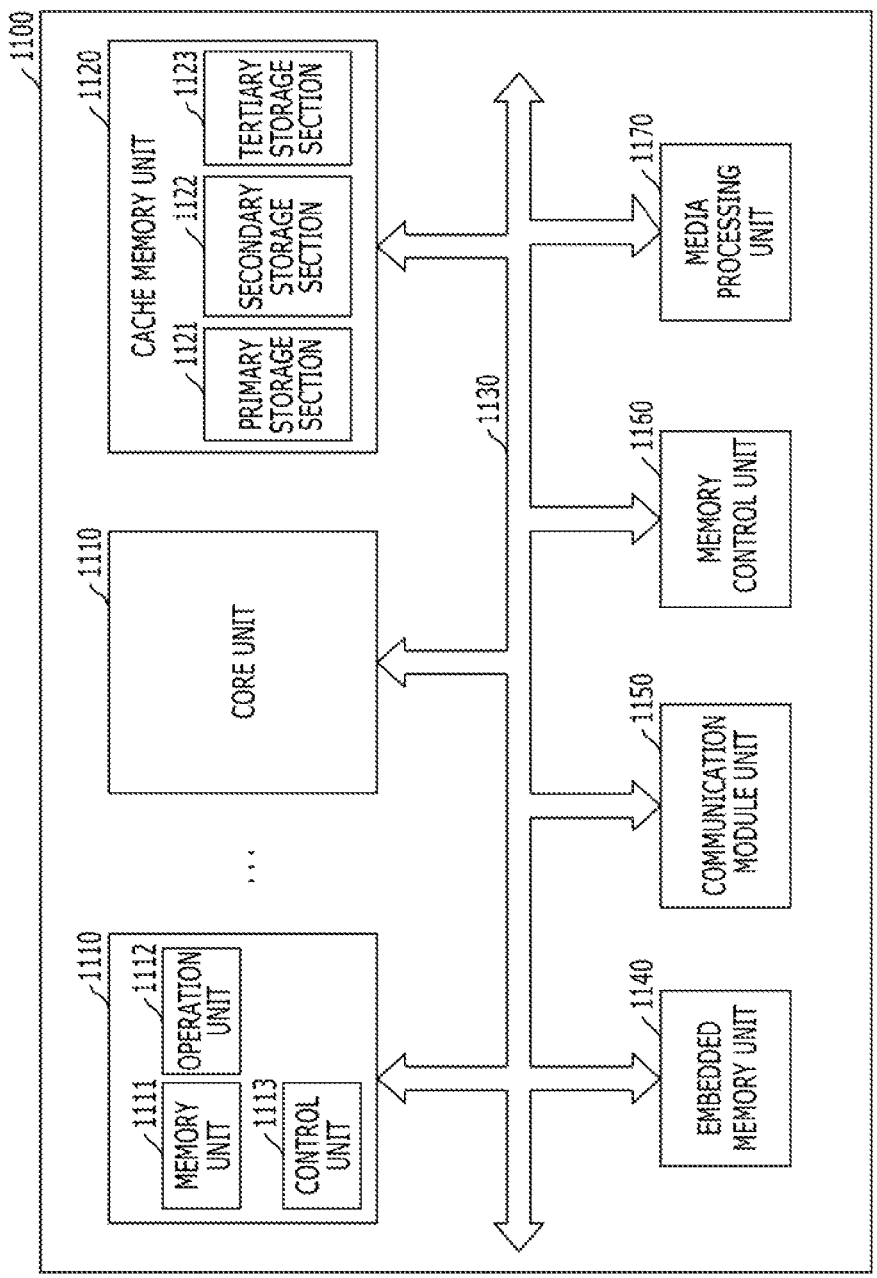
FIG. 8 is an example of a configuration diagram of a processor implementing memory circuitry based on the disclosed technology.

FIG. 8 is an example of configuration diagram of a processor implementing memory circuitry based on the disclosed technology.

Referring to FIG. 8, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a variable resistance element changing from a high resistance state to a low resistance state by performing a set operation and changing from the low resistance state to the high resistance state by performing a reset operation, a first reset voltage being applied to the variable resistance element to fully reset the variable resistance element, wherein the variable resistance element is mildly reset when a second reset voltage having a magnitude smaller than that of the first reset voltage is applied to the variable resistance element, and wherein the variable resistance element is fully reset when a third reset voltage having a magnitude smaller than that of the first reset voltage is applied to the variable resistance element after the variable resistance element is mildly reset Through this, data storage characteristics and operating characteristics of the cache memory unit 1120 may be improved. As a consequence, operating characteristics of the processor 1100 may be improved.

Although it was shown in FIG. 8 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 9:
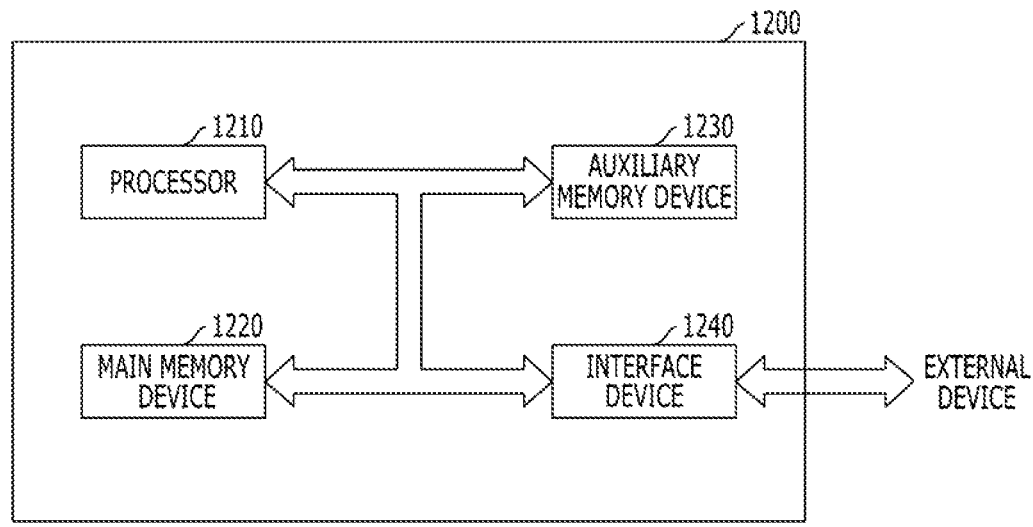
FIG. 9 is an example of a configuration diagram of a system implementing memory circuitry based on the disclosed technology.

FIG. 9 is an example of configuration diagram of a system implementing memory circuitry based on the disclosed technology.

Referring to FIG. 9, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a variable resistance element changing from a high resistance state to a low resistance state by performing a set operation and changing from the low resistance state to the high resistance state by performing a reset operation, a first reset voltage being applied to the variable resistance element to fully reset the variable resistance element, wherein the variable resistance element is mildly reset when a second reset voltage having a magnitude smaller than that of the first reset voltage is applied to the variable resistance element, and wherein the variable resistance element is fully reset when a third reset voltage having a magnitude smaller than that of the first reset voltage is applied to the variable resistance element after the variable resistance element is mildly reset Through this, data storage characteristics and operating characteristics of the main memory device 1220 may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a variable resistance element changing from a high resistance state to a low resistance state by performing a set operation and changing from the low resistance state to the high resistance state by performing a reset operation, a first reset voltage being applied to the variable resistance element to fully reset the variable resistance element, wherein the variable resistance element is mildly reset when a second reset voltage having a magnitude smaller than that of the first reset voltage is applied to the variable resistance element, and wherein the variable resistance element is fully reset when a third reset voltage having a magnitude smaller than that of the first reset voltage is applied to the variable resistance element after the variable resistance element is mildly reset Through this, data storage characteristics and operating characteristics of the auxiliary memory device 1230 may be improved. As a consequence, operating characteristics of the system 1200 may be improved.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 10:
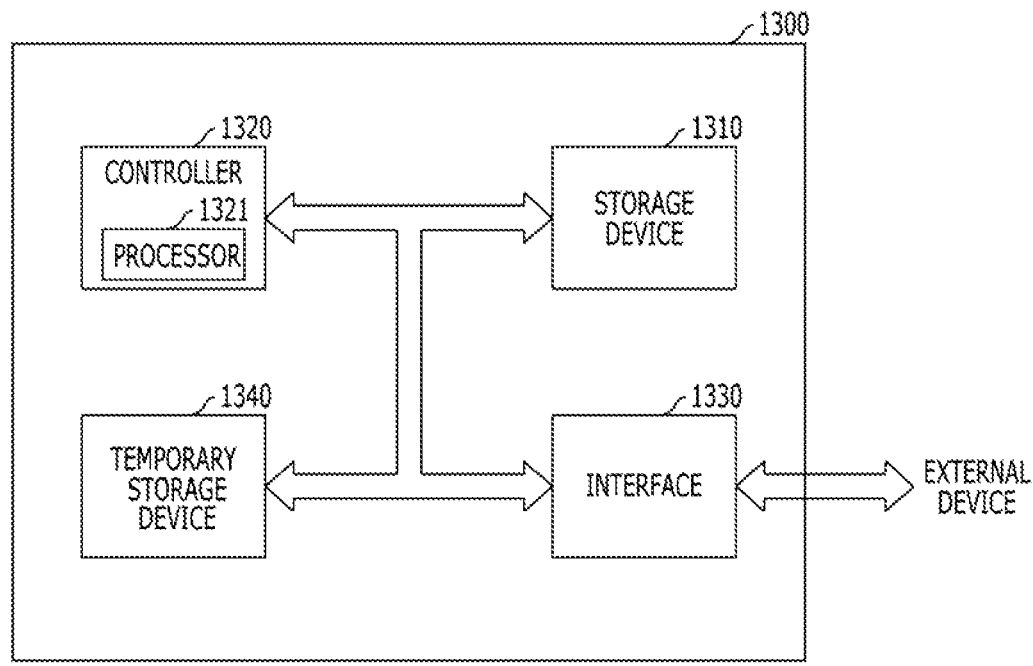
FIG. 10 is an example of a configuration diagram of a data storage system implementing memory circuitry based on the disclosed technology.

FIG. 10 is an example of configuration diagram of a data storage system implementing memory circuitry based on the disclosed technology.

Referring to FIG. 10, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a variable resistance element changing from a high resistance state to a low resistance state by performing a set operation and changing from the low resistance state to the high resistance state by performing a reset operation, a first reset voltage being applied to the variable resistance element to fully reset the variable resistance element, wherein the variable resistance element is mildly reset when a second reset voltage having a magnitude smaller than that of the first reset voltage is applied to the variable resistance element, and wherein the variable resistance element is fully reset when a third reset voltage having a magnitude smaller than that of the first reset voltage is applied to the variable resistance element after the variable resistance element is mildly reset Through this, data storage characteristics and operating characteristics of the temporary storage device 1340 may be improved. As a consequence, operating characteristics and data storage characteristics of the data storage system 1300 may be improved.

Figure 11:
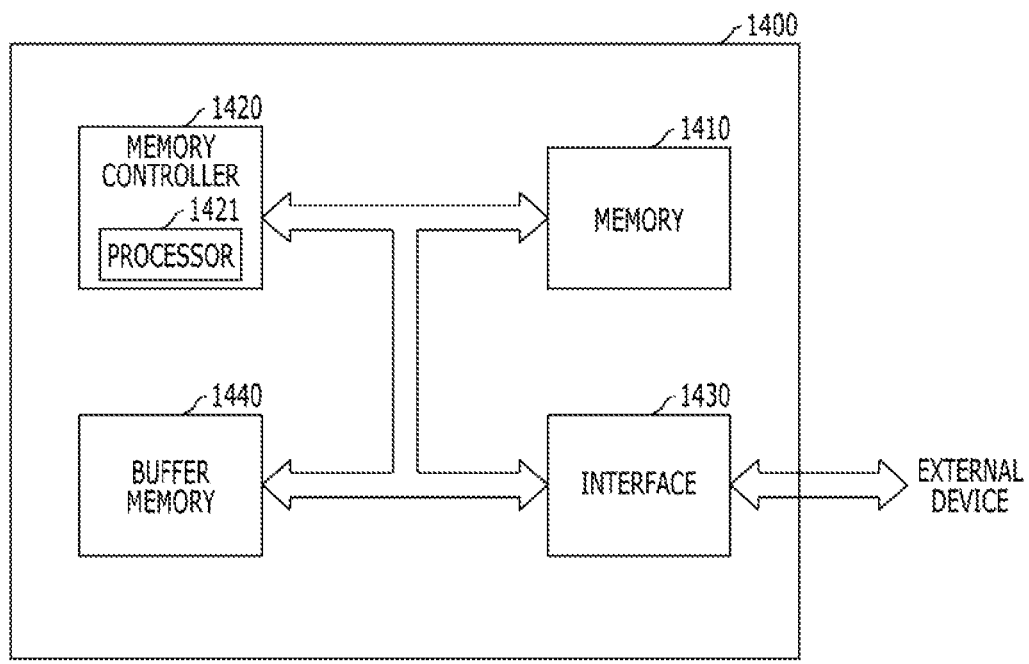
FIG. 11 is an example of a configuration diagram of a memory system implementing memory circuitry based on the disclosed technology.

FIG. 11 is an example of configuration diagram of a memory system implementing memory circuitry based on the disclosed technology.

Referring to FIG. 11, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a variable resistance element changing from a high resistance state to a low resistance state by performing a set operation and changing from the low resistance state to the high resistance state by performing a reset operation, a first reset voltage being applied to the variable resistance element to fully reset the variable resistance element, wherein the variable resistance element is mildly reset when a second reset voltage having a magnitude smaller than that of the first reset voltage is applied to the variable resistance element, and wherein the variable resistance element is fully reset when a third reset voltage having a magnitude smaller than that of the first reset voltage is applied to the variable resistance element after the variable resistance element is mildly reset Through this, data storage characteristics and operating characteristics of the memory 1410 may be improved. As a consequence, operating characteristics and memory characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a variable resistance element changing from a high resistance state to a low resistance state by performing a set operation and changing from the low resistance state to the high resistance state by performing a reset operation, a first reset voltage being applied to the variable resistance element to fully reset the variable resistance element, wherein the variable resistance element is mildly reset when a second reset voltage having a magnitude smaller than that of the first reset voltage is applied to the variable resistance element, and wherein the variable resistance element is fully reset when a third reset voltage having a magnitude smaller than that of the first reset voltage is applied to the variable resistance element after the variable resistance element is mildly reset Through this, data storage characteristics and operating characteristics of the buffer memory 1440 may be improved. As a consequence, operating characteristics and memory characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 7-11 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. A method of operating an electronic device including a variable resistance element, wherein the variable resistance element switches from a high resistance state to a low resistance state by performing a set operation and switches from the low resistance state to the high resistance state by performing a reset operation, and is fully reset by a first reset voltage applied thereto, the method comprising:
    performing the reset operation on the variable resistance element,
    wherein the performing of the reset operation comprises:
        applying a second reset voltage to the variable resistance element, the second reset voltage having a magnitude smaller than that of the first reset voltage;

determining whether the variable resistance element is mildly reset or not; and applying a third reset voltage to the variable resistance element when it is determined that the variable resistance element is mildly reset, or terminating the reset operation when it is determined that the variable resistance element is fully reset, the third reset voltage having a magnitude smaller than that of the first reset voltage, wherein the electronic device includes a plurality of variable resistance elements including the variable resistance element, wherein a minimum current among a plurality of currents flowing through the plurality of variable resistance elements in the low resistance state is a set current, the set current having a first magnitude, wherein a maximum current among a plurality of currents flowing through a first plurality of variable resistance elements that is fully reset is a first reset current, the first reset current having a second magnitude, wherein a maximum current among a plurality of currents flowing through a second plurality of variable resistance elements that is mildly reset is a second reset current, the second reset current having a third magnitude, the third magnitude being greater than the second magnitude, and wherein, when the variable resistance element is determined to be mildly reset, a current flowing through the variable resistance element has a magnitude between the second magnitude and the third magnitude, the second and third magnitudes being smaller than the first magnitude of the set current.

2. The method of claim 1, wherein the magnitude of the third reset voltage is smaller than or substantially equal to the magnitude of the second reset voltage.

3. The method of claim 1, wherein the first, second, and third reset voltages have the same polarity.

4. The method of claim 1, wherein, when the variable resistance element is fully reset, a first current flows through the variable resistance element, and when the variable resistance element is mildly reset, a second current flows through the variable resistance element, the second current having a magnitude greater than the first current.

5. The method of claim 1, wherein a resistance state of the variable resistance element varies depending on whether a conductive filament is formed in a variable resistance layer of the variable resistance element or not.

6. The method of claim 5, wherein a size of the conductive filament formed when the variable resistance element is mildly reset is larger than a size of the conductive filament formed when the variable resistance element is fully reset.

7. The method of claim 5, wherein the variable resistance layer includes a metal oxide, and the conductive filament includes oxygen vacancies included in the metal oxide.

8. An electronic device comprising:

a variable resistance element changing from a high resistance state to a low resistance state by performing a set operation and changing from the low resistance state to the high resistance state by performing a reset operation, a first reset voltage being applied to the variable resistance element to fully reset the variable resistance element, wherein the variable resistance element is mildly reset when a second reset voltage having a magnitude smaller than that of the first reset voltage is applied to the variable resistance element, and wherein the variable resistance element is fully reset when a third reset voltage having a magnitude smaller than that of the first reset voltage is applied to the variable resistance element after the variable resistance element is mildly reset, wherein the electronic device includes a plurality of variable resistance elements including the variable resistance element, and the plurality of variable resistance elements are fully reset by applying the first reset voltage thereto, wherein a minimum current among a plurality of currents flowing through the plurality of variable resistance elements in the low resistance state is a set current, the set current having a first magnitude, wherein a maximum current among a plurality of currents flowing through a first plurality of variable resistance elements that is fully reset is a first reset current, the first reset current having a second magnitude, wherein a maximum current among a plurality of currents flowing through a second plurality of variable resistance elements that is mildly reset is a second reset current, the second reset current having a third magnitude, the third magnitude being greater than the second magnitude, and wherein, when the variable resistance element is determined to be mildly reset, a current flowing through the variable resistance element has a magnitude between the second magnitude and third magnitude, the second and third magnitudes being smaller than the first magnitude of the set current.

9. The electronic device of claim 8, wherein the magnitude of the third reset voltage is smaller than or substantially equal to the magnitude of the second reset voltage.

10. The electronic device of claim 8, wherein the first, second, and third reset voltages have the same polarity.

11. The electronic device of claim 8, wherein a first current flows through the variable resistance element when the variable resistance element is fully reset, and a second current flows through the variable resistance element when the variable resistance element is mildly reset, the second current having a magnitude greater than the first current.

12. The electronic device of claim 8, wherein the variable resistance element includes a variable resistance layer, and wherein a resistance state of the variable resistance element varies depending on whether a conductive filament is formed in the variable resistance layer or not.

13. The electronic device of claim 12, wherein a size of the conductive filament when the variable resistance element is mildly reset is larger than a size of the conductive filament when the variable resistance element is fully reset.

14. The electronic device of claim 12, wherein the variable resistance layer includes a metal oxide, and the conductive filament includes oxygen vacancies included in the metal oxide.

15. A method of operating an electronic device including a variable resistance element, wherein the variable resistance element switches from a high resistance state to a low resistance state by performing a set operation and switches from the low resistance state to the high resistance state by performing a reset operation, and is fully reset by a first reset voltage applied thereto, the method comprising:

performing a first reset operation to mildly reset the variable resistance element, and performing a second reset operation to fully reset the variable resistance element, wherein performing the first reset operation comprises alternately applying a plurality of second reset voltage pulses and a plurality of first read voltage pulses to the variable resistance element, wherein performing the second reset operation comprises alternately applying a plurality of third reset voltage pulses and a plurality of second read voltage pulses to the variable resistance element, wherein the second reset voltage pulses and the third reset voltage pulses have a negative polarity, and the first read voltage pulses and the second read voltage pulses have a positive polarity, and wherein a minimum magnitude of the second reset voltage pulses is greater than a maximum magnitude of the third reset voltage pulses.

16. The method of claim 15, wherein a maximum magnitude of the second reset voltage pulses is smaller than a magnitude of the first reset voltage.

17. The method of claim 15, wherein a width of one of the second reset voltage pulses is greater than a width of a corresponding one of the third reset voltage pulses.

18. The method of claim 15, wherein a magnitude of one of the first read voltage pulses is equal to a magnitude of a corresponding one of the second read voltage pulses.

19. The method of claim 15, wherein a magnitude of one of the second reset voltage pulses is greater than a magnitude of a corresponding one of the third reset voltage pulses.

* * * * *